United States Patent
Perng et al.

(10) Patent No.: US 7,176,137 B2
(45) Date of Patent: Feb. 13, 2007

(54) METHOD FOR MULTIPLE SPACER WIDTH CONTROL

(75) Inventors: Baw-Ching Perng, Hsin-Chu (TW); Yih-Shung Lin, Sanchung (TW); Ming-Ta Lei, Hsin Chu (TW); Ai-Sen Liu, Hsinchu (TW); Chia-Hui Lin, Hsin-Chu (TW); Cheng-Chung Lin, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 230 days.

(21) Appl. No.: 10/435,009

(22) Filed: May 9, 2003

(65) Prior Publication Data

US 2004/0222182 A1    Nov. 11, 2004

(51) Int. Cl.
*H01L 21/302*    (2006.01)
(52) U.S. Cl. ............... 438/696; 438/700; 438/725; 438/738
(58) Field of Classification Search ........... 438/696, 438/725, 700, 738, 695
See application file for complete search history.

(56) References Cited

U.S. PATENT DOCUMENTS

| 5,783,475 A | * | 7/1998 | Ramaswami | 438/303 |
| 6,541,328 B2 | * | 4/2003 | Whang et al. | 438/231 |
| 2002/0195686 A1 | * | 12/2002 | Kim et al. | 257/621 |
| 2004/0137373 A1 | * | 7/2004 | Lei et al. | 430/313 |

* cited by examiner

*Primary Examiner*—George A. Goudreau
(74) *Attorney, Agent, or Firm*—Tung & Associates

(57) ABSTRACT

A method of forming pluralities of gate sidewall spacers each plurality comprising different associated gate sidewall spacer widths including providing a first plurality of gate structures; blanket depositing a first dielectric layer over the first plurality of gate structures; blanket depositing a second dielectric layer over the first dielectric layer; etching back through a thickness of the first and second dielectric layers; blanket depositing a first photoresist layer to cover the first plurality and patterning to selectively expose at least a second plurality of gate structures; isotropically etching the at least a second plurality of gate structures for a predetermined time period to selectively etch away a predetermined portion of the first dielectric layer; and, selectively etching away the second dielectric layer to leave gate structures comprising a plurality of associated sidewall spacer widths.

20 Claims, 2 Drawing Sheets

nying Figures.

METHOD FOR MULTIPLE SPACER WIDTH CONTROL

FIELD OF THE INVENTION

This invention generally relates to microelectronic integrated circuit (IC) semiconductor device fabrication and more particularly to a method for multiple spacer width control in forming multiple transistor structures on a semiconductor wafer die.

BACKGROUND OF THE INVENTION

With increasing demands for embedded memory type structures, mixed-signal circuits, and system on chip (SOC) IC design, it has become necessary to form multiple transistor structures on a single die to achieve integrated functioning of the different transistor structures. For example, transistors with different structures and functions typically operate under different current and voltage parameters requiring different LDD widths and depths for the various transistors. The width of the LDD region is typically controlled by the width of spacers formed adjacent to a semiconductor gate structure to act as a mask before or following one or more doping processes, for example ion implantation, to form regions of differing doping concentrations, for example source/drain (S/D) regions adjacent the LDD regions.

Although methods have been proposed in the prior art for forming multiple width sidewall spacers, the methods generally require an excessive number of photoresist patterning processes and etching processes and/or deposition processes to form gate sidewall spacers of different widths for different transistor designs formed on a single wafer or die.

Thus, there is a need in the semiconductor manufacturing art for an improved method for forming sidewall spacers of multiple widths including a reduced number of processing steps.

It is therefore an object of the invention to provide an improved method for forming sidewall spacers of multiple widths including a reduced number of processing steps while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method of forming pluralities of gate sidewall spacers each plurality comprising different associated gate sidewall spacer widths.

In a first embodiment, the method includes providing a first plurality of gate structures; blanket depositing a first dielectric layer over the first plurality of gate structures; blanket depositing a second dielectric layer over the first dielectric layer; etching back through a thickness of the first and second dielectric layers; blanket depositing a first photoresist layer to cover the first plurality and patterning to selectively expose at least a second plurality of gate structures; isotropically etching the at least a second plurality of gate structures for a predetermined time period to selectively etch away a predetermined portion of the first dielectric layer; and, selectively etching away the second dielectric layer to leave gate structures comprising a plurality of associated sidewall spacer widths.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

While the method of the present invention is explained with reference to formation of gate sidewall spacers it will be understood that the method of the present invention may be adapted for the formation of spacers in the formation of any semiconductor structure.

Figure 1A:
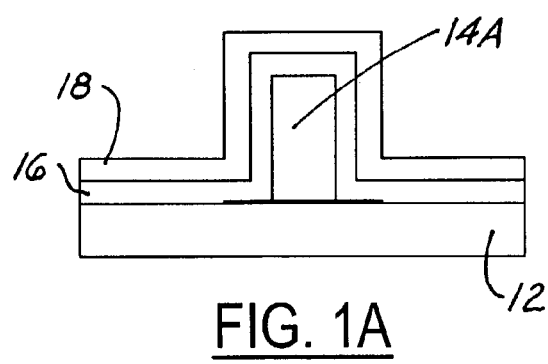
FIGS. 1A–1F are cross sectional side views of a portion of a semiconductor device at manufacturing stages according to an embodiment of the present invention.

Referring to FIG. 1A is shown a substrate 12, for example silicon, silicon on insulator (SOI), silicon oxide (e.g., $SiO_2$), silicon nitride (e.g., SiN), or silicon oxynitride (e.g., SiON). Overlying the substrate 12 is shown gate structure 14A. Although the details of the gate structure are not shown, the gate structure typically includes one or more gate dielectric layers formed over the substrate. A conductive gate material such as polysilicon, metal or SiGe is then deposited followed by a photolithographic patterning process to define the gate structure, and a plasma etching process, for example a polysilicon dry etching process, to form the gate 14A. It will be appreciated that the gate structure may include silicon oxide ($SiO_2$) or high-k dielectric gate dielectric structures formed of a metal oxides such as tantalum oxides (e.g., $Ta_2O_5$), titanium oxides, (e.g., $TiO_2$), hafnium oxides (e.g., $HfO_2$), yttrium oxides (e.g., $Y_2O_3$), and lanthanum oxides (e.g., $La_2O_5$). The gate structure 14A may include other materials as are known in the art for producing gate structures such as an overlying oxide or nitride liner. It will be appreciated that a plurality of gate structures e.g., 14A may be formed on a semiconductor process surface or on a die for forming a multiple transistor integrated circuit including having different gate structure dimensions, for examples, line widths or gate lengths.

According to an embodiment of the present invention a first dielectric layer 16 is blanket deposited over the semiconductor process wafer to cover the gate structures e.g., 14A. The dielectric layer 16 is preferably selected from the group consisting of oxides and nitrides, for example silicon oxide (e.g., $SiO_2$), carbon doped silicon oxide, silicon nitride. (e.g., $Si_3N_4$), and silicon oxynitride (e.g. SiON) Preferably, the first dielectric layer 16 is deposited to a thickness corresponding to a minimum sidewall spacer width desired, for example from about 100 Angstroms to about 1000 Angstroms. A second dielectric layer 18 is then deposited over the first dielectric layer 16 to form a sacrificial etching layer. The sacrificial etching layer 18 may vary in thickness depending on its selectivity to a subsequent first and second etching process, particularly the first etching process which is an isotropic etching process. Preferably, the sacrificial etching layer 18 is of sufficient thickness to survive a series of first etching processes to sequentially selectively etch away portions of the first dielectric layer 16 to produce different sidewall spacer widths for sequentially selected pluralities of gate structures e.g., 14A. Preferably, the sacrificial etching layer 18 has a relatively lower etch rate compared to the first dielectric layer 16 in a subsequent first etching process, an isotropic etching process, to remove a portion of the first dielectric layer to produce a sidewall spacer width. More preferably, the sacrificial etching layer 18 additionally has a relatively higher etch rate compared to the first dielectric layer in second etching process subsequent to the first etching process, for example an anisotropic etching process, to remove the sacrificial layer. It will be appreciated, however, that the method of the present invention may be applied where the first and second dielectric layers have about the same selectivity in the first and second etching processes. The sacrificial etching layer (second dielectric layer) 18 is preferably selected from the group consisting of oxides, nitrides, and carbides, for example silicon oxide (e.g., $SiO_2$), carbon doped silicon oxide, silicon nitride (e.g., $Si_3N_4$) and silicon oxynitride (e.g. SiON), silicon carbide (e.g., SiC), and silicon oxycarbide (e.g., SiOC), preferably selected to have a relatively lower etching rate compared to the first dielectric in the first etching process.

Figure 1B:
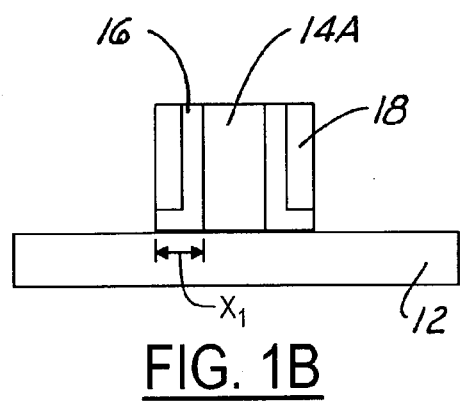
Figure 2A:
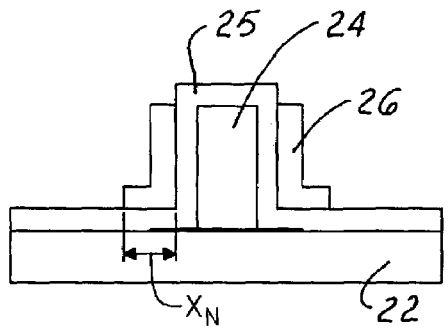
FIGS. 2A–2D are cross sectional side views of a portion of a semiconductor device at manufacturing stages according to an embodiment of the present invention.

Referring to FIG. 1B the first and second dielectric layers are etched back in an etch back process, for example in a dry etching process, to etch through the thickness of the first and second dielectric layers to stop on an underlying layer, for example, substrate 12 or dielectric liner layer 25 as shown in FIG. 2A. The etchback process exposes portions of the first and second dielectric layers on the sidewalls as well as the top portion of the etched back structure. The top portion of the gate structure or the dielectric liner layer 25 shown in the embodiment shown in FIG. 2A may be exposed as well. For example, a distance X1 ($X_N$ in FIG. 2A) defining a lateral distance that the first dielectric layer portion extends from the gate structure (or dielectric liner layer 25 covering the gate structure as shown in FIG. 2A) defines a first sidewall spacer width. It will be appreciated that the thickness of one or more dielectric layers overlaying the gate structure such as the dielectric liner layer 25 shown in FIG. 2A will be added to the overall sidewall spacer width.

Figure 1C:
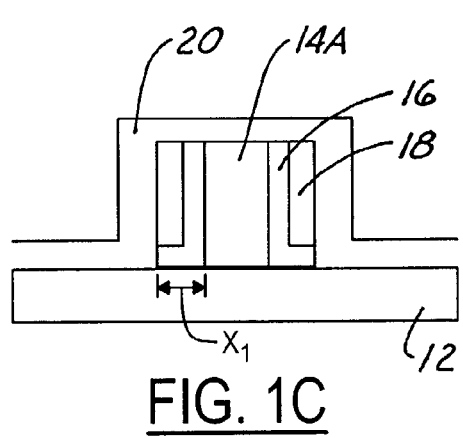

Referring to FIG. 1C, following etch back of the first and second dielectric layers to form a first sidewall spacer width X1, a first protective photoresist layer 20 is blanket deposited over the wafer to included covering the gate structure 14A and first and second dielectric layers, 16 and 18, respectively.

Figure 1D:
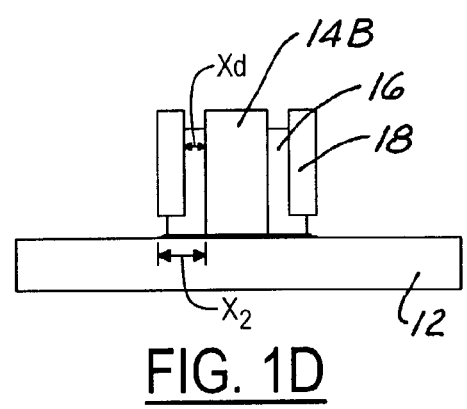

Referring to FIG. 1D, the protective photoresist layer 20 is removed over a first selected portion of the gate structures including exposing at least the first dielectric layer 16 by a conventional photolithographic patterning process. For example, shown in FIG. 1D is a gate structure representing one of the plurality of gate structures of the first selected portion now referred to as 14B shown with the protective photoresist layer 20 removed while remaining covering unpatterned portions of the plurality of gate structures e.g., 14A on the semiconductor wafer surface as represented in FIG. 1C. Optionally, the protective photoresist layer may remain covering (not shown) the top portion of the gate structure and/or the top portion of the sacrificial etching layer 18.

Still referring to FIG. 1D, at least a first isotropic etching process is carried out on the first selected portion of gate structures and associated dielectric layers 16 and 18 to selectively and isotropically remove a portion of the first dielectric layer 16 to produce a second sidewall spacer thickness denoted as X2 extending perpendicular to the gate structure 14B. For example, the particular isotropic etch process will depend on materials making up the first dielectric layer and the sacrificial layer as will be appreciated by a skilled practitioner. For example, wet etching solutions including hot phosphoric acid ($H_3PO_4$), dilute HF or buffered oxide etch (BOE) including ammonium fluoride, are commonly used for selectively isotropically etching nitrides and oxides, respectively. Following the at least a first isotropic etching process, the process of applying a protective photoresist layer 20 as shown in FIG. 1C is repeated followed by exposing a second selected portion of gate structures. The second exposed portion may be a subset of the first selected portion of gate structures or a different selected plurality of previously etched or unetched gate structures. Following exposure of at least the sidewall portions of the first dielectric layer another isotropic etching process (first etching process) is carried out for a predetermined period of time to produce another predetermined sidewall spacer width to produce sidewall spacer width Xn+1 where n isotropic wet etching processes have been carried out. For example the sidewall spacer width Xn+1 is different than Xn. The process of applying a protective photoresist layer and exposing a selected plurality of gate structures for isotropic etching may be repeated as long as the second dielectric layer (sacrificial etching layer) remains or the first dielectric layer is removed to form a sidewall spacer width corresponding to the first dielectric layer thickness as deposited e.g., Xd as shown in FIG. 1D.

Figure 1E:
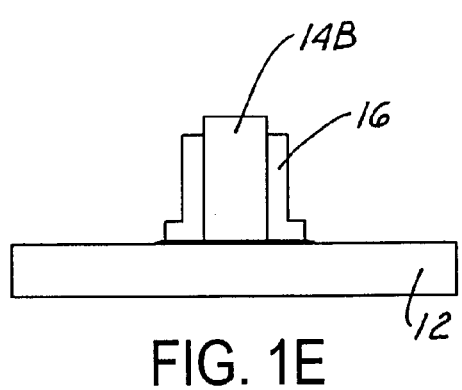

Referring to FIG. 1E, following at least a first isotropic etching process, the photoresist protective mask 20 (not shown), if present, is removed by a conventional wet stripping or ashing process followed by a second etching process to remove a remaining portion the second dielectric (sacrificial etching) layer to produce a series of pluralities of gate structures having different sidewall spacer thicknesses, e.g., n+1 different sidewall spacer thicknesses where n represents the number of isotropic etching processes carried out. The second etching process may be a wet or dry etching process as long as it provides a higher etching rate of the sacrificial etching layer compared to the first dielectric layer. Optionally, following removal of the protective photoresist layer 20 a second protective photoresist layer (not shown) may be deposited and patterned to selectively expose the sacrificial etching layer 18 followed by an anisotropic etching process to remove the sacrificial etching layer 18.

Figure 1F:
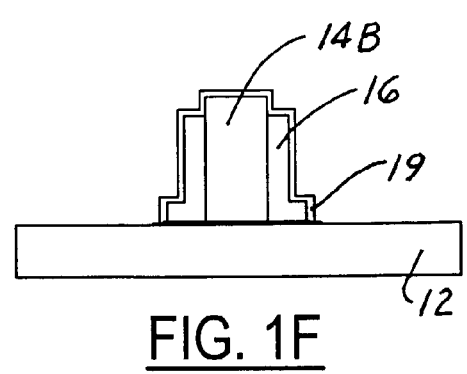

Referring to FIG. 1F, following removal of the sacrificial layer 18 and optional second protective photoresist layer, a third dielectric layer 19 is deposited over the gate structure including sidewall spacers (first dielectric layer) to protect the sidewall spacer in subsequent manufacturing processes. For example, the third dielectric layer 19 may be blanket deposited by CVD methods, such as LPCVD, PECVD, spin-coating methods, or thermal oxide growth methods which are known in the art. The third dielectric layer 19 is preferably an electrically insulating dielectric, for example silicon oxide containing. Preferably, the third dielectric layer is formed at a thickness of less than about 150 Angstroms.

Referring to FIG. 2A in another embodiment is shown a substrate 22, gate structure 24, first dielectric layer (sidewall spacer) 26, and dielectric liner layer 25 formed between the gate structure 24 and the sidewall spacer 26. In this embodiment, the dielectric liner layer 25 is blanket deposited (or grown) over the gale structure 24 and the substrate 22 prior to depositing the first dielectric layer from which the spacer 26 is formed. The process followed to form sidewall spacer 26 with width Xn is the same process as explained with respect to FIG. 1A through 1E except that the etchback process shown in FIG. 1B stops on the dielectric liner layer 25 to leave the dielectric liner layer 25 covering the substrate 22. It will ho appreciated that more than one dielectric liner layer may be deposited ever the gate structure prior to depositing the first dielectric layer and the second (sacrificial etching) layer and may be added to the sidewall spacer width Xn to form an effective sidewall spacer width. Preferably, the dielectric liner layer 25 is an oxide such as silicon oxide grown or deposited over the gate structure and substrate 22. The first dielectric layer, from which spacer 26 is formed, is preferably selected to have a higher etching rate in the first etching process (isotropic etching process) compared to the dielectric liner layer 25 and deposited second dielectric (sacrificial etching) layer e.g., 18 overlaying the first dielectric layer e.g., 16 as discussed with respect to FIG. 1C.

Figure 2B:
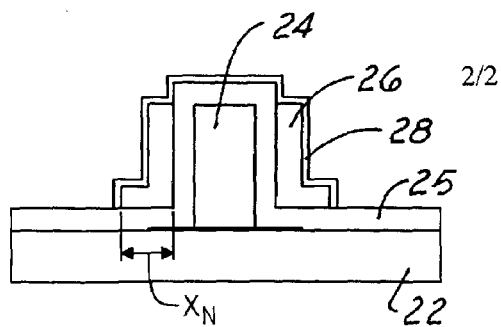
Figure 2C:
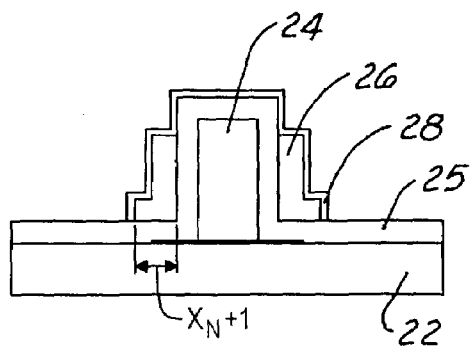
Figure 2D:
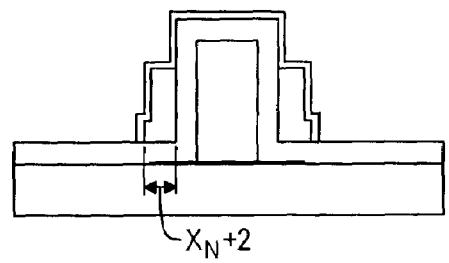

Referring to FIG. 2B, following the spacer sidewall formation process a third dielectric layer 28, preferably an electrically insulating layer, as explained with reference to FIG. 1F is formed over the gate structure including at least the dielectric liner layer 25 and sidewall spacers, e.g., 26, by a CVD deposition, spin-coating, or thermal oxide growth, such processes known in the art. Referring to FIGS. 2C and 2D are shown other selected gate structures with different sidewall spacer widths Xn+1 and Xn+2, respectively, produced by selectively exposing and etching for predetermined time periods as explained with reference to FIG. 1C and 1D.

Subsequent processes, such as salicide formation and ion implantation processes as are known in the art are then carried out to form doped areas in the substrate 12, for example HDD source/drain regions using the sidewall spacers, e.g., 26 as an ion implantation mask. Thus according to the present invention, an improved method has been presented for forming different sidewall spacer widths for different transistor devices in a semiconductor wafer manufacturing process where the number of processing steps required to produce the multiple sidewall spacer widths is reduced compared with prior art processes.

Figure 3:
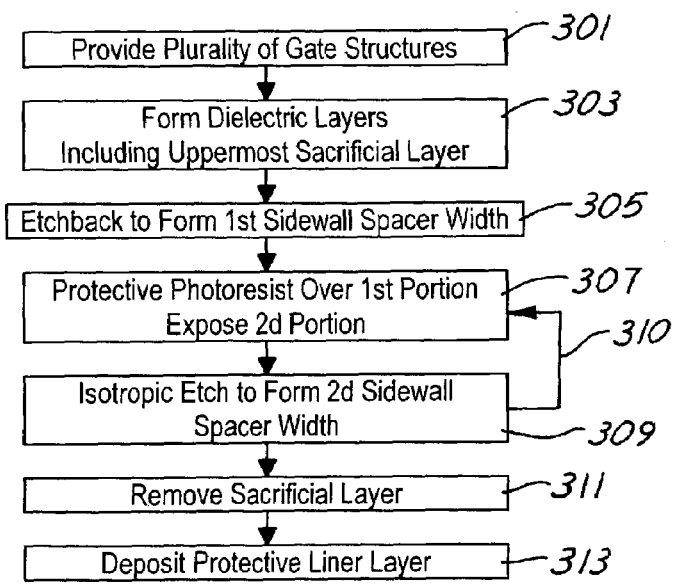
FIG. 3 is a process flow diagram including several embodiments of the present invention.

Referring to FIG. 3 is shown a process flow diagram including several embodiments of the present invention. In process 301, a plurality of gate structures overlying a substrate including an optional dielectric liner layer are provided. In process 303 first and second dielectric (sacrificial) layers are sequentially blanket deposited over the plurality of gate structures. In process 305, an etch back process is carried out to etch back the first and second dielectric layers stopping on a layer underlying the first dielectric layer and exposing first and second dielectric layers on a sidewall portion to form a first sidewall spacer width. In process 307, a protective photoresist layer is blanket deposited over a first plurality of gate structures including adjacently formed first and second dielectric layers and a photolithographic patterning process is carried out to expose a second portion of the gate structures. In process 309 an isotropic etching process is carried out to selectively remove a portion of the first dielectric layer to form a subsequent sidewall spacer width less that the first sidewall spacer width.

As indicated by directional process arrow 310, processes 307 and process 309 are repeated N times to form N+1 spacer widths. In process 311, the second dielectric layer (sacrificial layer) is removed in a second etching process leaving the gate structure and first dielectric layer forming a sidewall spacer width. In process 313, a third dielectric layer is deposited (or grown) to cover at least the sidewall spacers to form a protective dielectric layer.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming multiple gate sidewall spacer widths comprising the steps of:
   providing a first set of gate structures formed overlying a substrate;
   blanket depositing a first dielectric layer over the first set of gate structures;
   blanket depositing a second dielectric layer over the first dielectric layer;
   etching through a thickness of the first and second dielectric layers to expose the first dielectric layer, said first dielectric layer forming a first sidewall spacer width;
   blanket depositing a photoresist layer to selectively expose a second set of gate structures including said first dielectric layer;
   then isotropically etching the second set including said first dielectric layer to form said second set having a second sidewall spacer width;
   removing the photoresist layer; and,
   selectively etching away the second dielectric layer to form said gate structures comprising at least two sets of gate structures, each set having a different associated sidewall spacer width.

2. The method of claim 1, wherein the steps of blanket depositing a photoresist layer and isotropically etching are sequentially repeated more than once to form more than two sets of gate structures, each set having a different associated sidewall spacer width.

3. The method of claim 2, wherein the more than two sets comprises a subset of at least one of the first and second sets.

4. The method of claim 1, further comprising the step of forming a dielectric protective layer over said gate structures including associated sidewall spacers.

5. The method of claim 1, further comprising blanket depositing a dielectric liner layer over the first set of gate structures and substrate prior to the step of depositing a first dielectric layer.

6. The method of claim 1, wherein the second dielectric layer is selected from the group consisting of silicon oxide, silicon nitride, silicon oxynitride, silicon carbide, and silicon oxycarbide.

7. The method of claim 1, wherein the second dielectric layer has a lower etching rate in the step of isotropically etching compared to the first dielectric layer.

8. The method of claim 1, wherein the first dielectric layer is selected from the group consisting of silicon oxide, silicon nitride, and silicon oxynitride.

9. The method of claim 1, wherein the first dielectric layer has a lower etching rate in the step of selectively etching compared to the second dielectric layer.

10. The method of claim 1, wherein a second photoresist layer is deposited and patterned over the said exposed second set of gate structures to cover a top portion of said gate structures and a top portion of the second dielectric layer prior to the step of isotropically etching.

11. A method of forming a multiple sets of pates structures with different associated gate sidewall spacer widths comprising the steps of:
   providing a plurality of gate structures formed overlying a substrate, the gate structures comprising at least one overlying dielectric layer and a sacrificial etching layer on the at least one dielectric layer, the at least one dielectric layer having a higher etching rate compared to the sacrificial etching layer in an isotropic etching process;

etching through a thickness of the sacrificial layer and the first dielectric layer to expose a layer underlying the first dielectric layer thereby exposing the thickness of the first dielectric layer to form a first sidewall spacer width associated with a first set of gate structures;

blanket depositing and patterning a first photoresist layer to selectively expose a a second set of gate structures including exposing the first dielectric layer, said second set comprising a subset of said first set;

then isotropically etching the the second set of gate structures to selectively etch away a portion of the first dielectric layer to form at least a second sidewall spacer width; and, selectively etching away the sacrificial layer to form at least two sets of gates structures, each set having an associated sidewall spacer width different from another set.

12. The method of claim 11, wherein the steps of blanket depositing and isotropically etching are sequentially repeated more than once to form more than two sets of gate structures.

13. The method of claim 12, wherein the more than two sets comprises subsets of at least one of the at least two sets.

14. The method of claim 11, further comprising the step of forming a dielectric protective layer over said at least two sets of gate structures including associated sidewall spacers.

15. The method of claim 11, further comprising providing a dielectric liner layer over the gate structure and on the substrate, said dielectric liner underlying the first dielectric layer prior to the step of etching.

16. The method of claim 11, wherein the sacrificial dielectric layer is selected from the group consisting of silicon oxide, silicon nitride, silicon oxynitride, silicon carbide, and silicon oxycarbide.

17. The method of claim 11, wherein the first dielectric layer is selected to have a higher etching rate compared to the sacrificial layer in the step of isotropically etching.

18. The method of claim 11, wherein the sacrificial layer is selected to have a higher etching rate compared to the first dielectric layer in the step of selectively etching.

19. The method of claim 11, wherein the step of isotropic etching is performed more than once to form said at least a second sidewall spacer width.

20. The method of claim 11, wherein a second photoresist layer is formed over the exposed second set to selectively cover at least one of a gate structure top portion and the sacrificial layer top portion prior to the step of isotropically etching.

* * * * *